US008823133B2

(12) United States Patent
Jenkins et al.

(10) Patent No.: US 8,823,133 B2
(45) Date of Patent: Sep. 2, 2014

(54) INTERPOSER HAVING AN INDUCTOR

(75) Inventors: Michael O. Jenkins, San Jose, CA (US); James Karp, Saratoga, CA (US); Vassili Kireev, Sunnyvale, CA (US); Ephrem C. Wu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/075,059

(22) Filed: Mar. 29, 2011

(65) Prior Publication Data

US 2012/0248569 A1 Oct. 4, 2012

(51) Int. Cl.

| | |
|---|---|
| ***H01L 27/08*** | (2006.01) |
| ***H01L 25/18*** | (2006.01) |
| ***H01L 23/60*** | (2006.01) |
| ***H01L 23/64*** | (2006.01) |
| ***H01L 23/498*** | (2006.01) |
| *H01L 25/065* | (2006.01) |

(52) U.S. Cl.

CPC ..... *H01L 23/645* (2013.10); *H01L 2924/15311* (2013.01); *H01L 25/18* (2013.01); *H01L 23/60* (2013.01); *H01L 2924/15192* (2013.01); *H01L 2924/01019* (2013.01); *H01L 25/0655* (2013.01); *H01L 23/49822* (2013.01); *H01L 2224/16227* (2013.01); *H01L 23/642* (2013.01)

USPC .................................. 257/531; 257/E27.026

(58) Field of Classification Search

USPC .......................................... 257/531, E27.026

See application file for complete search history.

(56) References Cited

U.S. PATENT DOCUMENTS

| | | | |
|---|---|---|---|
| 5,349,743 | A | 9/1994 | Grader et al. |
| 5,880,925 | A | 3/1999 | DuPre et al. |
| 6,031,445 | A | 2/2000 | Marty et al. |
| 6,291,872 | B1 | 9/2001 | Wang et al. |
| 6,342,681 | B1 | 1/2002 | Goldberger et al. |
| 6,407,907 | B1 | 6/2002 | Ahiko et al. |
| 6,459,561 | B1 | 10/2002 | Galvagni et al. |
| 6,477,032 | B2 | 11/2002 | Makl, Jr. |
| 6,477,034 | B1 | 11/2002 | Chakravorty et al. |
| 6,534,249 | B2 | 3/2003 | Fork et al. |
| 6,548,338 | B2 | 4/2003 | Bernstein et al. |
| 6,606,237 | B1 | 8/2003 | Naito et al. |
| 6,611,188 | B2 | 8/2003 | Yeo et al. |
| 6,614,093 | B2 | 9/2003 | Ott et al. |

(Continued)

FOREIGN PATENT DOCUMENTS

CN 101 866 908 10/2010

OTHER PUBLICATIONS

U.S. Appl. No. 13/275,883, filed Oct. 18, 2011, Chong et al.

(Continued)

*Primary Examiner* — Marvin Payen

(74) *Attorney, Agent, or Firm* — W. Eric Webostad; Gerald Chan

(57) ABSTRACT

An embodiment of a multichip module is disclosed. For this embodiment of a multichip module, a semiconductor die and an interposer are included. The interposer has conductive layers, dielectric layers, and a substrate. Internal interconnect structures couple the semiconductor die to the interposer. External interconnect structures are for coupling the interposer to an external device. A first inductor includes at least a portion of one or more of the conductive layers of the interposer. A first end of the first inductor is coupled to an internal interconnect structure of the internal interconnect structures. A second end of the first inductor is coupled to an external interconnect structure of the external interconnect structures.

6 Claims, 8 Drawing Sheets

(56) References Cited

U.S. PATENT DOCUMENTS

| | | | | |
|---|---|---|---|---|
| 6,664,881 | B1 | 12/2003 | Thompson et al. | |
| 6,759,727 | B2 | 7/2004 | Ju | |
| 6,791,133 | B2 | 9/2004 | Farooq et al. | |
| 6,794,904 | B2 | 9/2004 | Ooishi et al. | |
| 6,828,666 | B1 | 12/2004 | Herrell et al. | |
| 6,891,258 | B1 | 5/2005 | Alexander et al. | |
| 6,961,231 | B1 | 11/2005 | Alexander et al. | |
| 6,975,199 | B2 | 12/2005 | Long et al. | |
| 7,071,807 | B1 | 7/2006 | Herbert | |
| 7,109,838 | B2 | 9/2006 | Brennan et al. | |
| 7,250,826 | B2 | 7/2007 | Gabara | |
| 7,429,899 | B2 | 9/2008 | Gabara | |
| 7,501,903 | B2 | 3/2009 | Gabara | |
| 7,508,280 | B2 | 3/2009 | Gabara | |
| 7,511,588 | B2 | 3/2009 | Gabara | |
| 7,701,319 | B2 | 4/2010 | Kitamura et al. | |
| 7,786,836 | B2 | 8/2010 | Gabara | |
| 8,068,004 | B1 | 11/2011 | Chong et al. | |
| 2002/0101702 | A1 | 8/2002 | Maki, Jr. | |
| 2003/0001287 | A1 | 1/2003 | Sathe | |
| 2003/0062602 | A1 | 4/2003 | Frutschy et al. | |
| 2005/0212127 | A1 | 9/2005 | Savastiouk et al. | |
| 2006/0128059 | A1 | 6/2006 | Ahn et al. | |
| 2006/0170527 | A1 | 8/2006 | Braunisch | |
| 2006/0284718 | A1 | 12/2006 | Baumgartner et al. | |
| 2007/0247268 | A1 | 10/2007 | Oya et al. | |
| 2007/0268105 | A1 | 11/2007 | Walls | |
| 2008/0084265 | A1 | 4/2008 | Kitamura et al. | |
| 2008/0129394 | A1 | 6/2008 | Kissing et al. | |
| 2008/0297299 | A1 | 12/2008 | Yun et al. | |
| 2008/0309442 | A1 | 12/2008 | Hebert | |
| 2008/0315356 | A1* | 12/2008 | Reisner | 257/531 |
| 2009/0039916 | A1 | 2/2009 | Buchmann et al. | |
| 2009/0189725 | A1 | 7/2009 | Ding et al. | |
| 2010/0026368 | A1 | 2/2010 | Tang et al. | |
| 2010/0067154 | A1 | 3/2010 | Deng et al. | |
| 2010/0109133 | A1* | 5/2010 | Ito et al. | 257/660 |
| 2010/0127937 | A1 | 5/2010 | Chandrasekaran et al. | |
| 2010/0327424 | A1 | 12/2010 | Braunisch et al. | |
| 2011/0084765 | A1 | 4/2011 | Kim et al. | |
| 2011/0095395 | A1 | 4/2011 | Ellul et al. | |
| 2011/0169171 | A1 | 7/2011 | Marcoux | |
| 2011/0215472 | A1 | 9/2011 | Chandrasekaran | |
| 2011/0259411 | A1 | 10/2011 | Liu | |
| 2011/0291288 | A1 | 12/2011 | Wu et al. | |
| 2012/0146209 | A1 | 6/2012 | Hu et al. | |
| 2012/0147578 | A1* | 6/2012 | Jin et al. | 361/774 |

OTHER PUBLICATIONS

U.S. Appl. No. 13/416,640, filed Mar. 9, 2012, Abugharbieh et al.

"ALLVIA to Present Latest Data for Silicon Interposers and Embedded Capacitors at IMAPS 2011," Marketwire.com, Sep. 28, 2011, downloaded Jan. 17, 2012 <http://www.marketwire.com/printer_friendly?id=1566307>.

"Xilinx Uses TSV+MLM interposers for 28nm FPGA—BetaBlog," Betasights.com, Nov. 8, 2010, 4 pp., downloaded Jan. 17, 2012. <betasights.net/wordpress/?p=1189>.

Carlson, J. et al., "A Stackable Silicon Interposer with Integrated Through-Wafer Inductors," *Proc. of the 57th Electronic Components and Technology Conference*, May 29, 2007, pp. 1235-1238, IEEE, Piscataway, New Jersey, USA.

Lee, Heeseok et al., "Power Delivery Network Design for 3D SIP Integrated over Silicon Interposer Platform," *Proc. of the 57th Electronic Components and Technology Conference*, May 29, 2007, pp. 1193-1198, IEEE, Piscataway, New Jersey, USA.

Mori, Toshiaki et al., "Development of a New Interposer Including Embedded Thin Film Passive Elements," *IEEE Transactions on Advanced Packaging*, May 2009, pp. 503-508, vol. 32, No. 2, IEEE, Piscataway, New Jersey, USA.

Yoon, Jun-Bo et al., "Surface Micromachined Solenoid On-Si and On-Glass Inductors for RF Applications," IEEE Electron Device Letters, Sep. 1999, pp. 487-489, vol. 20, No. 9, IEEE, Piscataway, New Jersey, USA.

Yue, C. Patrick, "On-Chip Spiral Inductors with Patterned Ground Shields for Si-Based RF IC's," IEEE Journal of Solid-State Circuits, May 1998, pp. 743-752, vol. 33, No. 5, IEEE, Piscataway, New Jersey, USA.

Galal, S., "Broadband ESD Protection Circuits in CMOS Technology", IEEE Journal of Solid-State Circuits, vol. 38, No. 12, Dec. 2003, pp. 2334-2340.

Kossel, M., et al., "A T-Coil-Enhanced 8.5 Gb/s High-Swing SST Transmitter in 65 nm Bulk CMOS With <-16 dB Return Loss Over 10 GHz Bandwidth", IEEE Journal of Solid-State Circuits, vol. 43, No. 12, Dec. 2008, pp. 2905-2920.

Pillai, E.R., et al., "Novel T-Coil Structure and Implementation in a 6.4-Gb/s CMOS Receiver to Meet Return Loss Specifications", $57^{th}$ 2007 Electronic Components and Technology Conference, May 29-Jun. 1, 2007, pp. 147-153, Reno, NV USA.

Galal S. et al., "Broadband ESD protection circuits in CMOS technology", IEEE Journal of Solid-State Circuits, IEEE Service Center, vol. 38, No. 12, Dec. 1, 2003, pp. 2334-2340, Piscataway, NJ USA.

Selmi L., et al., "Small-signal MMIC Amplifiers with bridged T-Coil Matching Networks", IEEE Journal of Solid-State Circuits, IEEE Service Center, vol. 27, No. 7, Jul. 1, 1992, pp. 1093-1096, Piscataway, NJ USA.

U.S. Appl. No. 13/187,234, filed Jul. 20, 2011, Kireev et al., Xilinx, Inc., 2100 Logic Drive, SJ, CA, USA.

U.S. Appl. No. 13/329,832, filed Dec. 19, 2011, Rahman et al., Xilinx, Inc., 2100 Logic Drive, SJ, CA USA.

Braunisch, Henning et al., "High-Speed Performance of Silicon Bridge Die-to-Die Interconnects," IEEE International Conference on Electrical Performance of Electronic Packages and Systems (EPEPS-2011), Oct. 23, 2011, pp. 95-98, EPEPS Administration, Urbana, Illinois, USA, http://epeps.ece.illinois.edu/.

Vishay Intertechnology, An Introduction to Substrate PIMIC (Passive Integrated Microelectronic Interconnect Circuitry) Technology, Tech Note 61082, Mar. 27, 2007, pp. 1-13, Vishay Intertechnology, Malvern, Pennsylvania, USA.

U.S. Appl. No. 12/699,734, filed Feb. 3, 2010, Nui Chong et al., Xilinx, Inc., 2100 Logic Drive, SJ, CA USA.

Telli, A., "Practical performance of planar spiral inductors", ICECS 2004, Proceedings of the 2004 $11^{th}$ International Conference, Tel-Aviv, Israel, p. 487-490, Dec. 13-15, 2004.

* cited by examiner

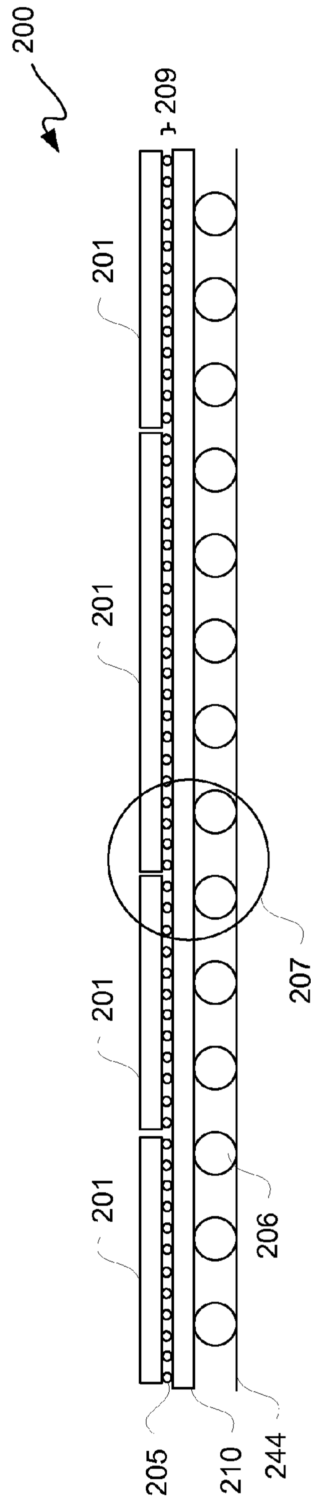
FIG. 2
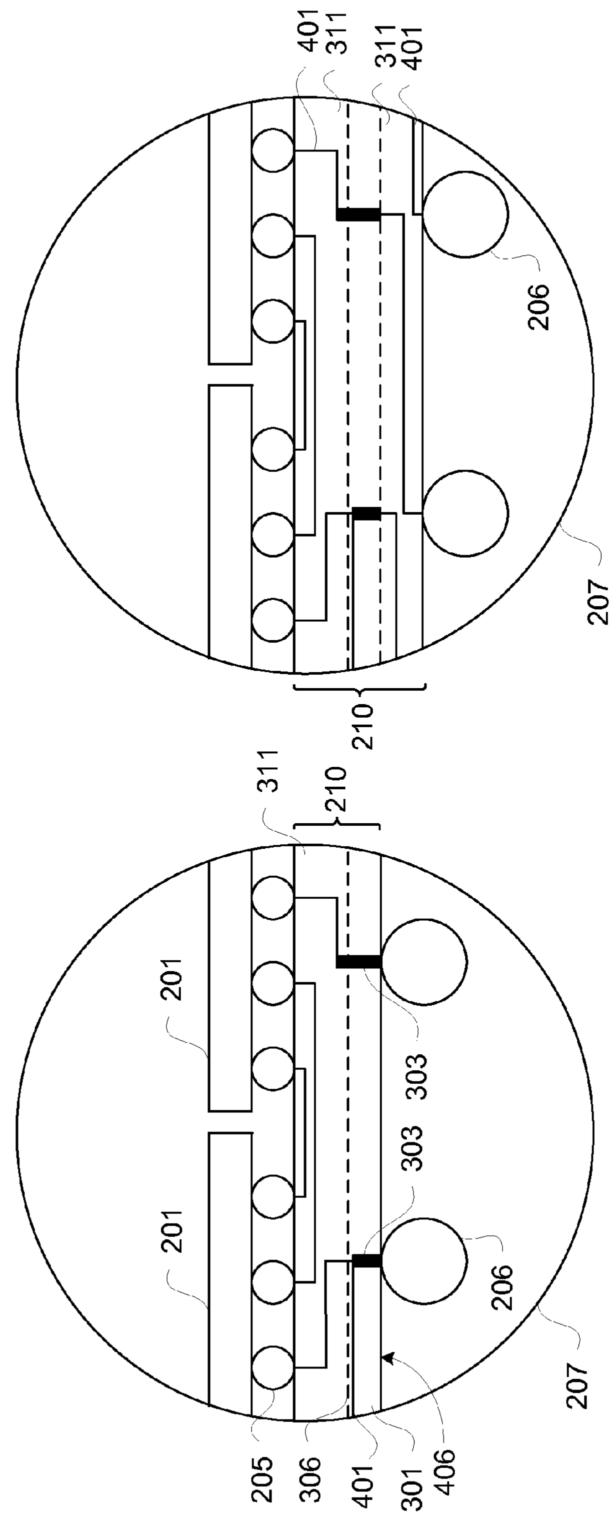
FIG. 4
FIG. 3

INTERPOSER HAVING AN INDUCTOR

FIELD OF THE INVENTION

An embodiment of the invention relates to integrated circuit devices ("ICs"). More particularly, an embodiment of the invention relates to a multichip module and/or transceiver with an interposer having an inductor.

BACKGROUND

ICs have become faster over time, i.e., frequency of operation of ICs has increased. With higher frequencies of operation, issues like return loss and/or frequency response have become more relevant. Hence, it is desirable and useful to provide an IC that addresses one or more of these issues.

SUMMARY

One or more embodiments generally relate to a multichip module and/or transceiver with an interposer having an inductor.

An embodiment relates generally to a multichip module. In such an embodiment, a semiconductor die and an interposer are included. The interposer has conductive layers, dielectric layers, and a substrate. Internal interconnect structures couple the semiconductor die to the interposer. External interconnect structures are for coupling the interposer to an external device. A first inductor includes at least a portion of one or more of the conductive layers of the interposer. A first end of the first inductor is coupled to an internal interconnect structure of the internal interconnect structures. A second end of the first inductor is coupled to an external interconnect structure of the external interconnect structures.

Another embodiment relates generally to another multichip module. In such an embodiment, an interposer has a first inductor and a first plate of a capacitor. A semiconductor die has a second inductor and a second plate of the capacitor. The interposer and the semiconductor die are interconnected to one another for coupling the first inductor and the second inductor in series, where the interposer and the semiconductor die are positioned relative to one another for inductive coupling between the first inductor and the second inductor and for capacitive coupling between the first plate and the second plate during operation of the T-coil network.

Yet another embodiment relates generally to a transceiver. In such an embodiment, a T-coil network is provided as part of the transceiver. The T-coil network includes a first inductor and a second inductor coupled in series. The T-coil network further includes a capacitor coupled in parallel with the series formed by the first inductor and the second inductor. An interposer includes the first inductor, and a semiconductor die includes the second inductor. The interposer and the semiconductor die are interconnected to one another. The first inductor and the second inductor are positioned relative to one another for inductive coupling during operation of the transceiver.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

FIG. 2 is a side view depicting an exemplary embodiment of a multichip module.

FIGS. 3 and 4 are respective enlarged views of a portion of the side view of FIG. 2 depicting respective exemplary embodiments of an interposer.

DETAILED DESCRIPTION

Figure 1:
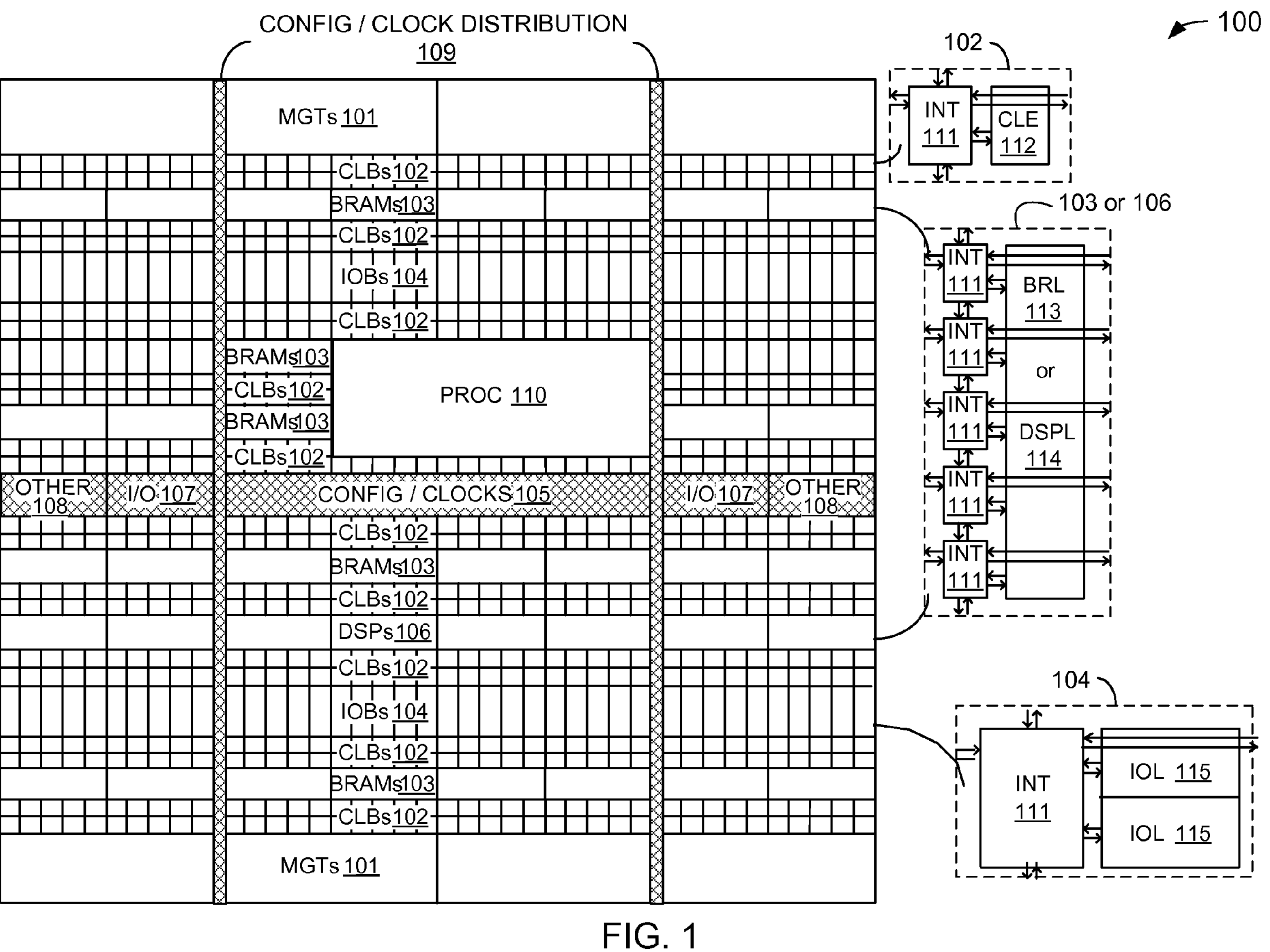
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Before describing exemplary embodiments illustratively depicted in the several figures, a general introduction is provided to further understanding. Inductive networks, including without limitation a single inductor, multiple inductors, or a T-coil for example, may be used to improve return loss and/or frequency response of circuitry of an IC. However, placing inductive networks in a semiconductor die may cause problems associated with operation of circuitry of such a semiconductor die. Thus, in one embodiment, all or some of such inductive network may be located on an interposer or carrier of a multichip module. Furthermore, in another embodiment, for an interposer, where conductive layers are formed both above and below a substrate, such as a semiconductor substrate, an inductive network may be located further away from the semiconductor die in order to reduce the likelihood of causing interference with operation of circuitry of such semiconductor die by such inductive network. An inductor may be formed as described in additional detail in co-pending patent application entitled "EMBEDDED INDUCTOR" by Nui Chong, et al., filed Feb. 3, 2010, assigned application Ser. No. 12/699,734, which is incorporated by reference herein in its entirety for all purposes.

An interposer having an inductive network may have an ability to cancel or reduce interposer specific capacitive loading. Such interposer specific capacitive loading may be related to one or more of through substrate or silicon vias ("TSVs"), interposer routing, or a die-to-interposer interconnects, such as microbumps for example. Such reduction or cancellation in capacitive loading of an interposer may be useful for high-speed operation, such as for use of a serializer-deserializer ("SERDES").

With the above general understanding borne in mind, some embodiments for a multichip module are generally described below. In an embodiment of a multichip module, and inductor is formed using one or more conductive layers of an interposer, such as for use with an input, output, or input/output pin. In another embodiment, a T-coil network is formed where part of such network is located on a semiconductor die, and another part of such network is located on an interposer. A capacitor of such T-coil network has one plate on the semiconductor die and another plate on the interposer with the gap between them. This avoids having to use pins or interconnects, namely a single interconnect already assigned to an input, output, or input/output may be used. Thus no interconnect overhead may be consumed by use of such T-coil network. In yet another embodiment, a T-coil network is implemented as part of a transceiver.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 2 is a side view depicting an exemplary embodiment of a multichip module 200. Multichip module 200 includes multiple semiconductor die 201, interconnect structures 205, interposer or carrier 210, and interconnect structures 206. Interconnect structures 205 are generally internal to multichip module 200, and interconnect structures 206 are generally external to multichip module 200. Accordingly, for purposes of clarity and not limitation, interconnect structures 205 are generally referred to as internal interconnect structures 205, and interconnect structures 206 are generally referred to as external interconnect structures 206. External interconnect structures 206 may be attached to interposer 210 for coupling interposer 210 to an external device, such as for attachment of multichip module 200 to a printed circuit board 244 for example.

It should be understood that multichip module 200 may be enclosed, encapsulated, covered or the like; however, such enclosure, encapsulation, covering, or the like is not illustratively depicted so as not to obscure the internal configuration of multichip module 200. Furthermore, for purposes of clarity by way of example not limitation, it shall be assumed that dice 201 are located above interposer 210 for purposes of reference using bottom and top surfaces. However, it should be understood that multichip module 200 may be used in any angularly rotated orientation from that illustratively depicted in FIG. 2.

Semiconductor die 201 may be any of a variety of types of die. For example, one of semiconductor die 201 may be an FPGA 100; another of semiconductor die 201 may be a memory chip; and others of semiconductor die 201 may be these or other types of semiconductor dice.

Semiconductor dice 201 may be interconnected to interposer 210 with internal interconnect structures 205. For purposes of clarity by way of example not limitation, it shall be assumed that internal interconnect structures 205 are "microbumps" or "micro-balls." Additionally, for purposes of clarity by way of example not limitation, it shall be assumed that external interconnect structures 206 are "C4" bumps or balls. However, it should be understood that these or other types of interconnect structures may be used in accordance with description herein.

Internal interconnect structures 205 offset semiconductor die 201 from interposer 210, and thus bottom surfaces of dice 201 and a top surface of interposer 210 define a gap 209. For purposes of clarity by way of example not limitation, it shall be assumed that gap 209 is an air gap. However, it should be understood that because multichip module 200 may be enclosed, another type of gas may be used.

FIGS. 3 and 4 are respective enlarged views of a portion 207 of the side view of FIG. 2 depicting respective exemplary embodiments of an interposer 210. Interposer 210 of FIG. 3 includes a substrate 301 above which may be formed using one or more dielectric layers 311 and one or more conductive layers 401. For purposes of clarity by way of example not limitation, it shall be assumed that substrate 301 is a semiconductor substrate, such as a silicon substrate for example. However, it should be understood that if interposer 210 is for example not going to include any transistors or diodes, use of a semiconductor substrate may be avoided. For example, a dielectric substrate which is not a semiconductor substrate may be used for a "passive" interposer.

Conductive layers 401 may be used to form one or more traces and/or vias. In other words, conductors may include traces formed on a top surface of interposer 210, in a dielectric layer of interposer 210, between dielectric layers of interposer 210, or between a dielectric layer and a top surface 306 of substrate 301 of interposer 210. It should further be understood that conductors may include traces formed in substrate 301 or vias formed in or through substrate 301 of interposer 210. TSVs 303 may extend from a bottom surface 406 to a top surface 306 of substrate 301. However, it should be understood that TSVs 303 may extend above or below a top surface 306 of substrate 301.

Interposer 210 of FIG. 3 has one or more conductive layers 401 and one or more dielectric layers 311 formed above substrate 301. In contrast, interposer 210 of FIG. 4 has one or more conductive layers 401 and one or more dielectric layers 311 formed both above and below substrate 301. It should be understood that substrate 301 may be repetitively inverted for forming layers, and thus it should be understood that reference to above and below substrate 301 are only to a completely fabricated interposer 210.

Thus it should be understood that for a signal path going from or to an internal interconnect structure 205 to or from an external interconnect structure 206, a conductive path provided by one or more conductive layers 401 in interposers 210 of FIG. 3 or 4 may be used.

Figure 5:
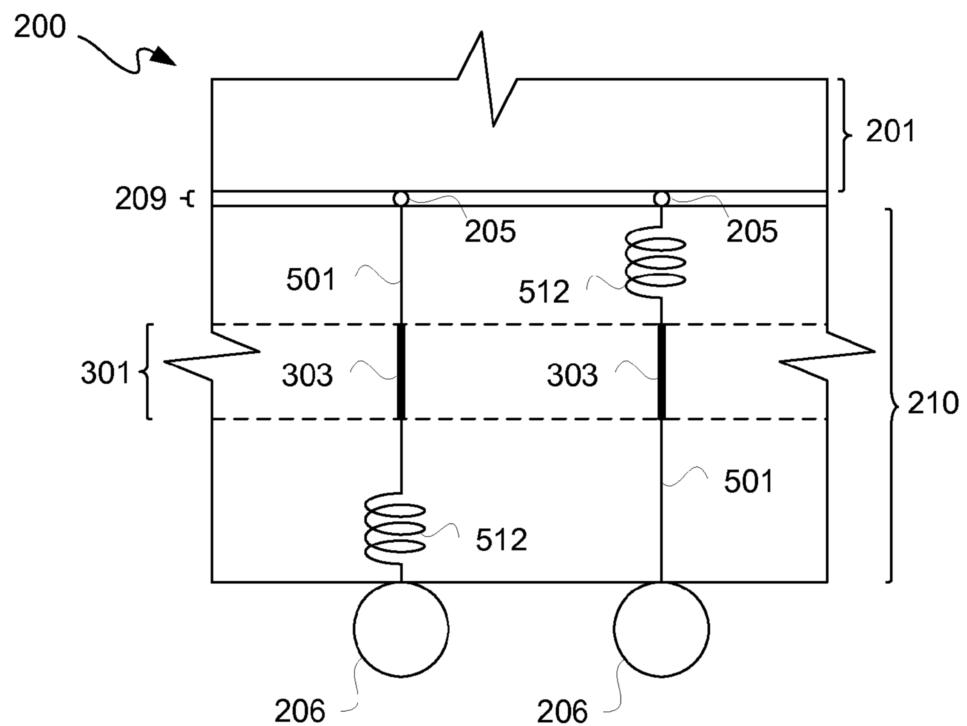
FIG. 5 is a cross-sectional view depicting an exemplary embodiment of a multichip module having an interposer with inductors.

FIG. 5 is a cross-sectional view depicting an exemplary embodiment of a multichip module 200 having an interposer 210 with inductors 512. Inductor 512 on the left may be formed using one or more conductive layers 401 located below substrate 301. Inductor 512 on the right may be formed using one or more conductive layers 401 located above substrate 301. Thus, inductor 512 on the left may be located a further distance away from semiconductor die 201 than inductor 512 on the right, where inductor 512 on the right is formed using one or more conductive layers 401 located above substrate 301.

If interposer 210 is or is like that illustratively depicted in FIG. 3, then inductor 512 on the right may only be formed in one or more conductive layers 401 located above substrate 301, and thus design of semiconductor die 201 may have to more rigorously account for inductance from inductor 512 on the right than inductor 512 on the left. Furthermore, because inductor 512 on the left is further from semiconductor die 201, a larger inductor may be used than inductor 512 on the right. In other words, more inductance may be tolerated by multichip module 200 if such inductance is further removed from semiconductor die 201. Additionally, inductors 512 may alternate between being above and below substrate 301 so as to reduce cross-coupling of inductance between neighboring signal paths.

However, in either embodiment, namely whether interposer 210 is of a configuration with one or more conductive layers located above substrate 301 or located above and below substrate 301, signal paths 501 between interconnect structures 205 and 206 may be formed with respective inductors 512.

TSVs 303 may be formed to provide for signal paths 501. Thus, inductor 512 on the left may have an end coupled to external interconnect structure 206 and another end coupled to a TSV 303, which TSV 303 may be coupled to an internal interconnect structure 205. For inductor 512 on the right, another internal interconnect structure 205 may be coupled to an end of inductor 512 on the right, and another end of inductor 512 on the right may be coupled to another TSV 303, which TSV 303 may be coupled to an external interconnect structure 206.

Figure 6:
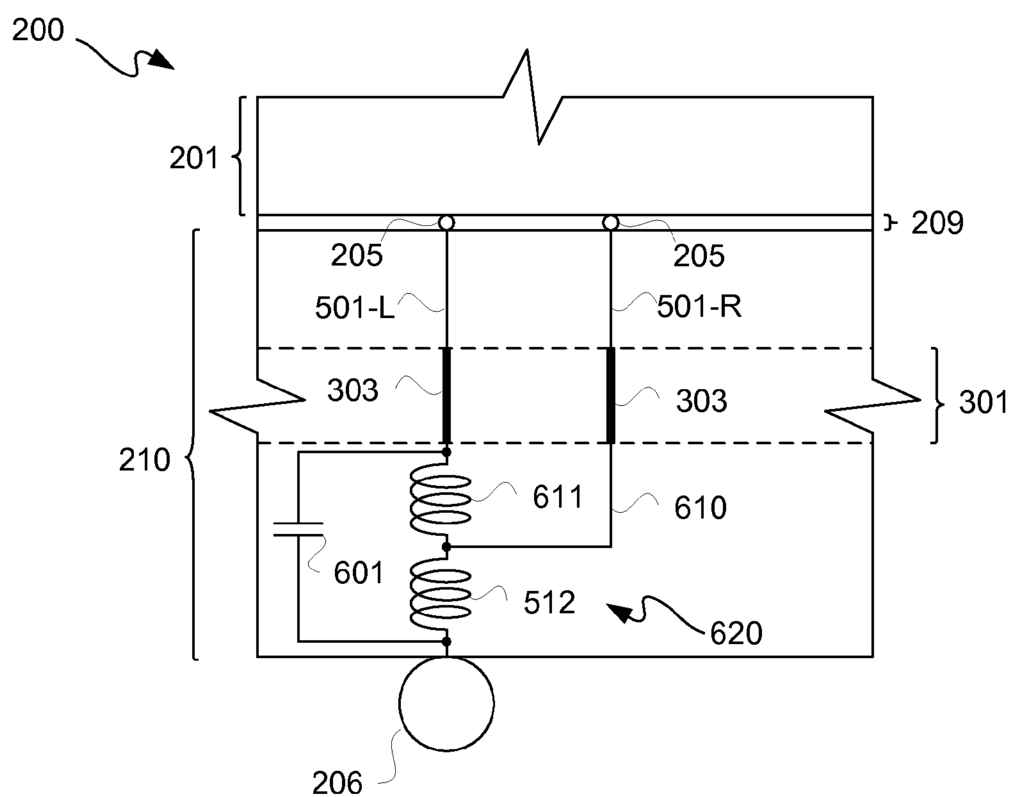
FIG. 6 is a cross-sectional view depicting an exemplary embodiment of a multichip module having a T-coil network.

FIG. 6 is a cross-sectional view depicting an exemplary embodiment of a multichip module 200 having a T-coil network 620. In this exemplary embodiment, T coil network 620 is formed below substrate 301. However, in another embodiment, T-coil network 620 may be formed above substrate 301 in interposer 210, whether an interposer 210 of a configuration as in FIG. 3 or 4 is used.

T-coil network 620 includes an inductor 611, an inductor 512, and a capacitor 601. In this exemplary embodiment, inductors 512 and 611 are formed below substrate 301 as a series of inductors with a node 610 between them. Inductor 611 and inductor 512 are positioned with respect to one another for inductive coupling during operation of multichip module 200. Formed in parallel with the series of inductors 512 and 611 may be a capacitor 601. For this configuration, two internal interconnect structures 205 are used to support a single external interconnect structure 206.

More particularly, external interconnect structure 206 is coupled to an end of inductor 512 and a bottom plate of capacitor 601. Another end of inductor 512 is coupled to an end of inductor 611 through node 610. Another end of inductor 611 is coupled to a top plate of capacitor 601 and to a TSV 303 on the left. TSV 303 on the left is coupled to an internal interconnect structure 205 on the left. Such internal interconnect structure 205 on the left may be coupled to a termination circuit in semiconductor die 201 to provide a reference voltage level, such as a logic low, logic high, or some other voltage level. Node 610 is coupled to a TSV 303 on the right for coupling to an internal interconnect structure 205 on the right. Internal interconnect structure 205 on the right may be coupled to an input, output, or input/output driver in semiconductor die 201, as described below in additional detail.

T-coil network 620 may be used to reduce return loss and/or increase frequency response for signaling provided between internal and external interconnect structures of multichip module 200. However, in this configuration, for each T-coil network 620, two internal interconnect structures 205 are used for each external interconnect structure 206.

Figure 7:
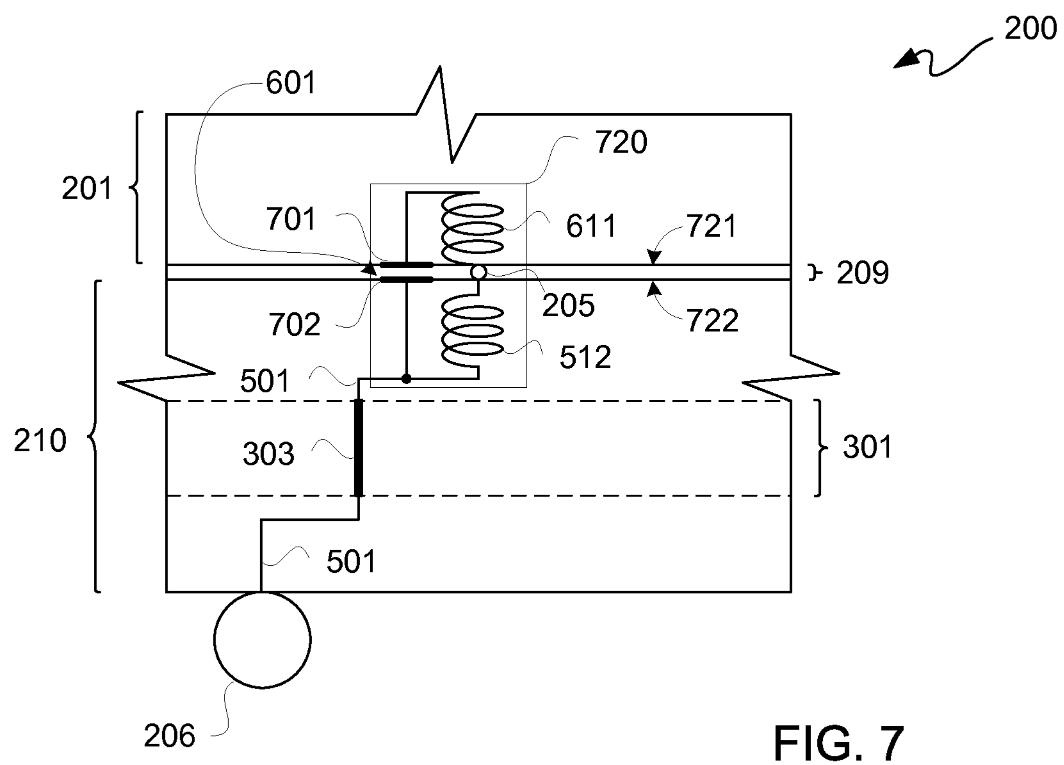
FIGS. 7 and 8 are cross-sectional views depicting respective exemplary embodiments of multichip modules each having a T-coil network formed in part on a semiconductor die and on an interposer.
Figure 8:
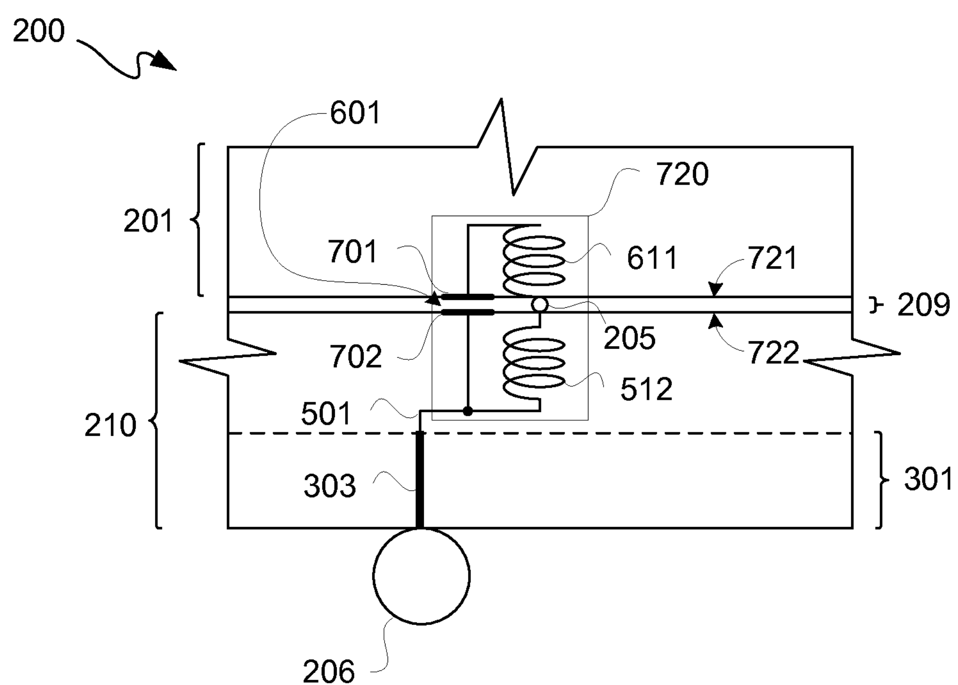

FIGS. 7 and 8 are cross-sectional views depicting respective exemplary embodiments of multichip modules 200 each having a T-coil network 720 formed in part on a semiconductor die 201 and on an interposer 210. Because T-coil network 720 is significantly different from T-coil network 620 of FIG. 6, a different reference number is used for T-coil network 720, for reasons which shall become more apparent from the following description.

Multichip modules 200 of FIGS. 7 and 8 are the same except that multichip module 200 of FIG. 7 uses an interposer 210 of the configuration in FIG. 4, and multichip module 200 of FIG. 8 uses an interposer 210 of the configuration in FIG. 3. Accordingly, for purposes of clarity by way of example and not limitation, multichip modules 200 of FIGS. 7 and 8 are described with simultaneous reference to FIGS. 7 and 8.

For interposer 210, an external interconnect structure 206 is coupled to a TSV 303 of such interposer 210. Such TSV 303 is coupled to an end of inductor 512 and a bottom plate 702 of a capacitor 601. Each of inductor 512 and bottom plate 702 is formed as part of interposer 210. Inductor 512 and bottom plate 702 are part of T-coil network 720. Another end of inductor 512 is coupled to internal interconnect structure 205. Internal interconnect structure 205 may be used as a node, akin to node 610 of FIG. 6, located between a series formed of inductors 512 and 611.

For semiconductor die 201, an end of an internal interconnect structure 205 is coupled to an end of inductor 611 of such semiconductor die 201. Such inductor 611 has another end coupled to a top plate 701 of capacitor 601. Inductor 611 and top plate 701 are part of T-coil network 720. Each of top plate 701 and inductor 611 is formed as part of a semiconductor die 201.

It should be understood that the term “plate” as used herein does not refer to any particular shape, but merely refers to conductive member that may be used in a capacitor spaced apart by a capacitor dielectric from another conductive member of such capacitor. In this example, a capacitor dielectric is air gap 209, or more particularly a portion of air gap 209 located between plate 701 and 702. Accordingly, internal interconnect structures 205 offsetting semiconductor die 201 from interposer 210 at least in part provide or create air gap 209, which in this exemplary embodiment may be used to provide a dielectric constant, k. Generally, the relative dielectric constant of air at 1 atm. is approximately 1 relative to a vacuum, and thus an air gap capacitor dielectric may be used in applications where capacitance generally may be measured in approximately a 10 to 200 femtofarad range.

It should be understood that top plate 701 may be formed on a bottom surface 721 of semiconductor die 201. It should further be understood that bottom plate 702 may be formed on a top surface 722 of interposer 210. It should further be understood that either or both of plates 701 and 702 may be recessed such that they are coplanar or substantially coplanar (“substantially coplanar”) with surfaces 721 and 722, respectively. It should further be understood that either or both of plates 701 and 702 may be formed such that they extend above or below surfaces 721 and 722, respectively. Generally, an exposed surface of top plate 701, namely a bottom surface of top plate 701, and an exposed surface of bottom plate 702, namely a top surface of bottom plate 702, may be substantially coplanar with one another. Even though a multichip module may be enclosed, as previously described, for purposes of clarity it should be understood that an exposed surface of top plate 701 may be considered an external surface of semiconductor die 201, and an exposed surface of bottom plate 702 may be considered an external surface of interposer 210.

Inductors 611 and 512 are positioned for inductive coupling during operation. In other words, semiconductor die 201 and interposer 210 are aligned when attached to one another for forming multichip module 200 such that inductors 512 and 611 are inductively coupled during operation of multichip module 200. Likewise, top plate 701 and bottom plate 702 are positioned for capacitive coupling during operation of T-coil network 720. In other words, semiconductor die 201 and interposer 210 are aligned when attached to one another for forming multichip module 200 such that top plate

701 and bottom plate 702, with an air gap 209 between them, are positioned for capacitive coupling during operation of multichip module 200. Accordingly, when semiconductor die 201 and interposer 210 are interconnected, a capacitor 601 is formed and is coupled in parallel with a series of inductors, namely inductors 611 and 512 coupled in series. A node between inductors 611 and 512 may be used for signaling, as described below in additional detail. Other details regarding T-coil network 720 are described below in additional detail.

It should be understood that in FIGS. 7 and 8, a signal path 501 is provided using a single internal interconnect structure 205 and a corresponding single external interconnect structure 206. Accordingly, such configuration may conserve internal interconnect structures 205 in comparison to the configuration of FIG. 6.

Figure 9:
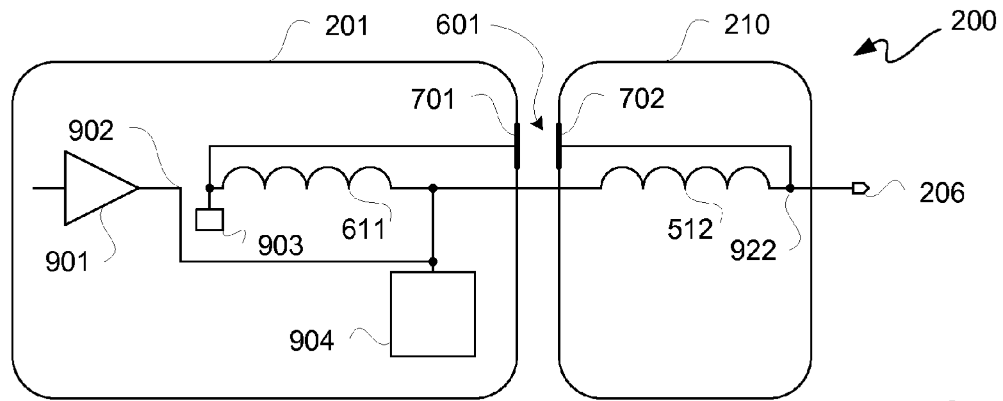
FIG. 9 is a block/circuit diagram depicting an exemplary embodiment of an input driver path of a multichip module having a T-coil network.

FIG. 9 is a block/circuit diagram depicting an exemplary embodiment of an input driver path of a multichip module 200 having a T-coil network 720 of FIG. 7. In this exemplary embodiment, inductor 512, inductor 611, and capacitor 601 are formed as previously described with reference to FIGS. 7 and 8. In FIG. 9, an output of an output driver circuit ("driver") 901 is coupled to a node 902. Node 902 couples inductors 611 and 512 in series. Internal interconnect structure 205 is not illustratively depicted in FIG. 9 for purposes of clarity and not limitation.

An external interconnect structure 206, which in this exemplary embodiment is an output pin, is coupled to node 922. Node 922 is further coupled to an end of inductor 512 and to bottom plate 702.

Generally, an input, output, or input/output pin is protected against an electrostatic discharge ("ESD"), such as caused by improper handling. Accordingly, an ESD circuit 904 may be coupled to node 902. ESD circuit 904 in this exemplary embodiment is in a semiconductor die 201. Because ESD circuit 904, which may include one or more diodes involving doped semiconductor wells is not located in interposer 210, interposer 210 is what may be referred to as "a passive" interposer, namely as having no circuits using doped semiconductor wells.

An end of inductor 611, not connected to node 902, may be coupled to a termination circuit 903 and to top plate 701. Termination circuit 903 may be a resistor coupled to supply voltage, a ground, or other termination circuit, which may vary depending on signaling protocol used.

Figure 10:
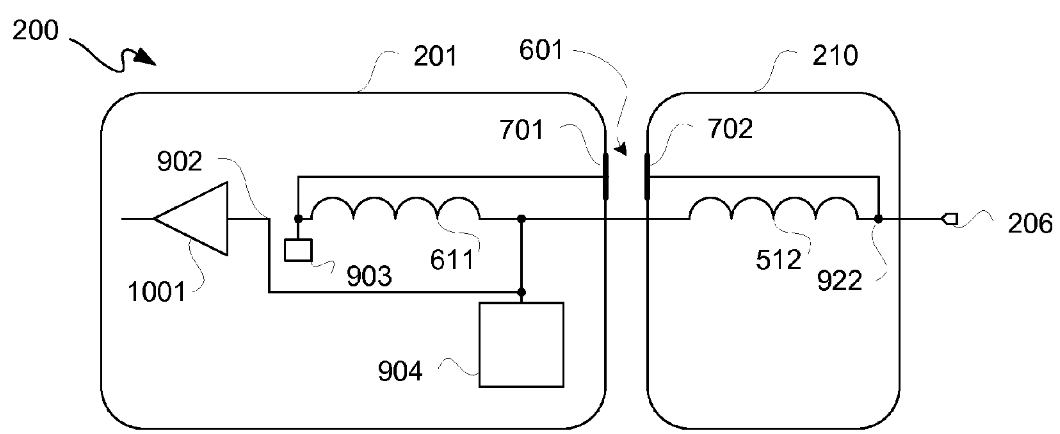
FIG. 10 is a block/circuit diagram depicting an exemplary embodiment of an output driver path of a multichip module having a T-coil network.

FIG. 10 is a block/circuit diagram depicting an exemplary embodiment of an output driver path of a multichip module 200 having a T-coil network 720 of FIG. 7. FIG. 10 is the same as FIG. 9, except that rather than an output driver 901 as in FIG. 9, an input driver 1001 is illustratively depicted FIG. 10, and thus external interconnect structure 206 is an input pin. In FIG. 10, an input of input driver 1001 is coupled to node 902. The remainder of FIG. 10 is as previously described with reference to FIG. 9, and thus such description is not repeated.

Figure 11:
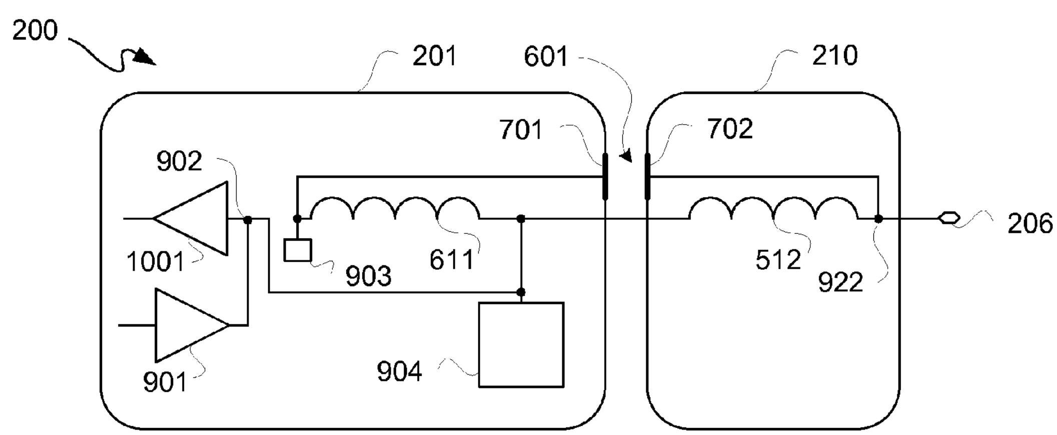
FIG. 11 is a block/circuit diagram depicting an exemplary embodiment of an input/output driver path of a multichip module having a T-coil network.

FIG. 11 is a block/circuit diagram depicting an exemplary embodiment of an input/output driver path of a multichip module 200 having a T-coil network 720 of FIG. 7. FIG. 11 is the same as FIG. 9, except that rather than an output driver 901 as in FIG. 9, an input driver 1001 and an output driver 901 are illustratively depicted in FIG. 11, and thus external interconnect structure 206 is an input/output pin. In FIG. 11, an input of input driver 1001 is coupled to node 902, and an output of output driver 901 is coupled to node 902. The remainder of FIG. 11 is as previously described with reference to FIG. 9, and thus such description is not repeated.

Figure 12:
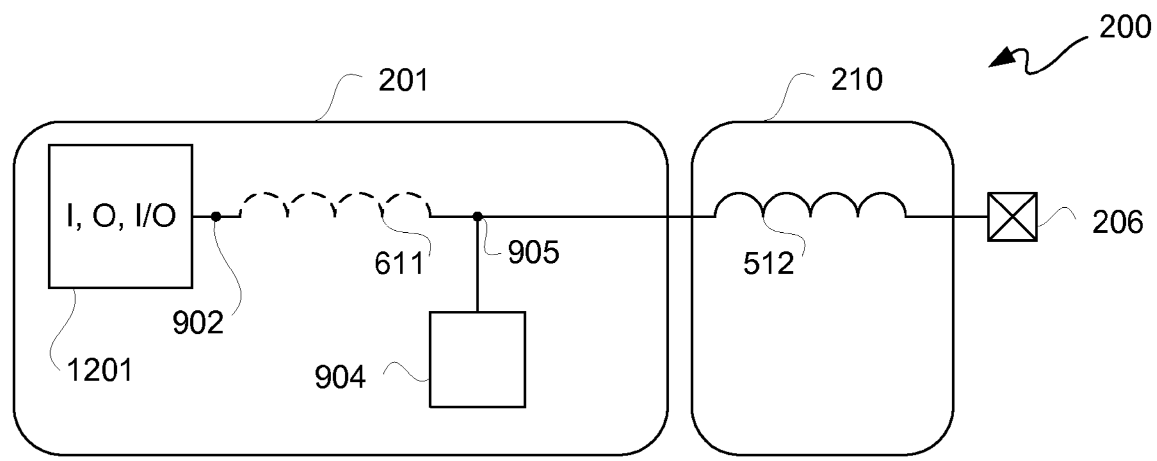
FIGS. 12 and 13 are block/circuit diagrams depicting respective exemplary embodiments of any of an input, output, or input/output path of a multichip module having an inductive network.
Figure 13:
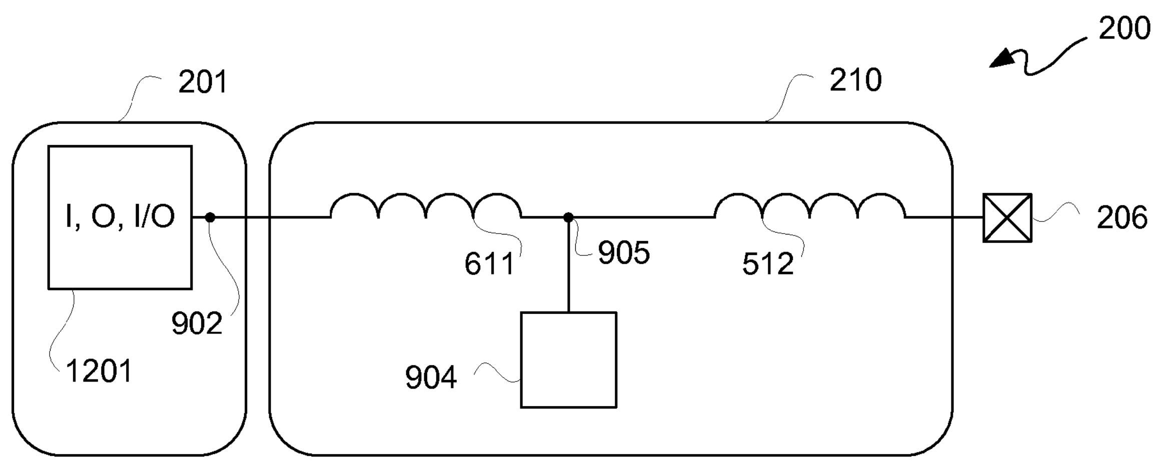

FIGS. 12 and 13 are block/circuit diagrams depicting respective exemplary embodiments of any of an input, output, or input/output path of a multichip module 200 having an inductive network.

With reference to FIG. 12, interposer 210 includes inductor 512. An end of inductor 512 is coupled to an external interconnect structure 206. In this exemplary embodiment, ESD circuit 904 is located in semiconductor die 201. As inductor 512 forms a "passive" inductive network, interposer 210 may be thought of as a passive interposer.

Another end of inductor 512 is coupled to node 905. ESD circuit 904 of semiconductor die 201 may be coupled to node 905. Semiconductor die 201 may further include an input driver, an output driver, or input/output driver, as generally depicted by block 1201, and thus external interconnect structure 206 is generally illustratively depicted as a pad.

Thus, as previously described with reference to FIGS. 9 through 11, node 902 may be an input node, output node, or input/output node. In this embodiment, nodes 902 and 905 are the same node. If, however, an optional inductor 611 is included with semiconductor die 201 as positioned between nodes 902 and 905, nodes 902 and 905 are not the same node.

Assuming optional inductor 611 is included as part of semiconductor die 201, inductors 611 and 512 may be positioned for inductive coupling with one another during operation of multichip module 200. However, it should be understood that no capacitor is used in this exemplary embodiment, as this exemplary embodiment does not employ a T-coil network.

With reference to exemplary embodiment of FIG. 13, both inductors 611 and 512 are formed as part of an interposer 210. Inductors 611 and 512 are coupled in series at node 905. An end of inductor 611 is coupled to node 902 in this embodiment, and node 902 is coupled to a port of block 1201 as previously described with reference to FIG. 12. Furthermore, an end of inductor 512 is coupled to an external interconnect structure 206, as previously described with reference to FIG. 12.

In this exemplary embodiment, ESD circuit 904 is formed as part of interposer 210. Again, ESD circuit 904 may be coupled at node 905. ESD circuit 904 may include one or more diodes formed using wells formed in a semiconductor substrate, such as substrate 301 of FIG. 3 or 4. Thus, in this exemplary embodiment, interposer 210 may be thought of as an "active" interposer.

Figure 14:
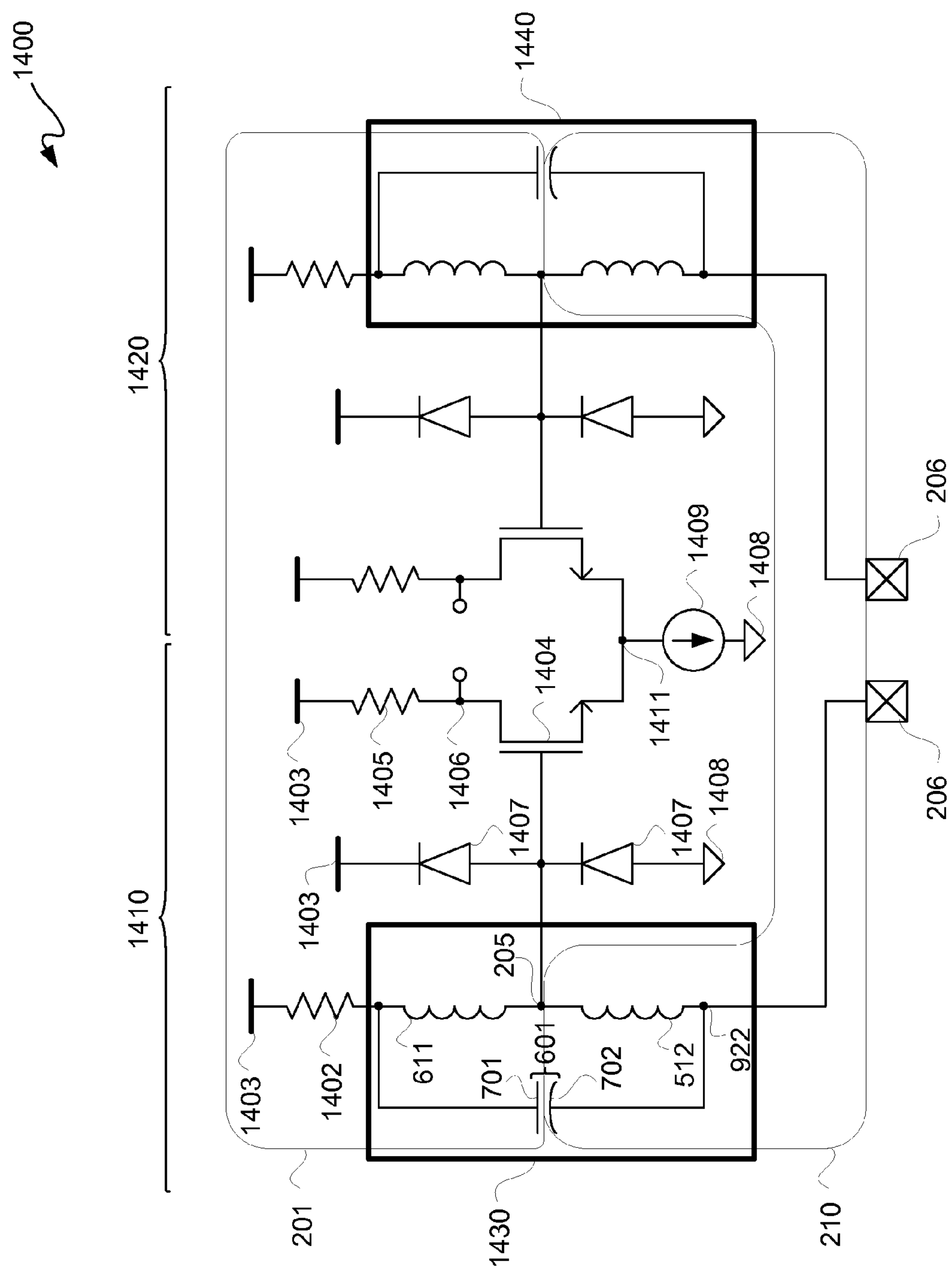
FIG. 14 is a block/circuit diagram depicting an exemplary embodiment of a differential transceiver having T-coil networks.

FIG. 14 is a block/circuit diagram depicting an exemplary embodiment of a differential transceiver 1400 having T-coil networks 1430 and 1440. T-coil networks 1430 and 1440 are respectively associated with a left circuit half 1410 coupled to a left external interconnect structure 206 and a right circuit half 1420 coupled to a right external interconnect structure 206. In other words, differential transceiver 1400 may be thought of as two circuit halves, namely circuit half 1410 and circuit half 1420, where circuit halves 1410 and 1420 are interconnected at a common node 1411 for sharing a common current source circuit 1409 coupled to a ground 1408. Accordingly for purposes of clarity and not limitation, only circuit half 1410 is described to avoid repetition.

In this exemplary embodiment, inductor 512 is coupled to node 922, which node 922 is further coupled to bottom plate 702 and to a left external interconnect structure 206, which is illustratively depicted as a pad. It should be understood that capacitor 601 may be formed using top and bottom plates 701 and 702 as previously described. Thus, an interposer 210 may include inductor 512 and bottom plate 702, as previously described and as illustratively depicted in FIGS. 7 and 8. Optionally, capacitor 601 may be formed entirely in either interposer 210 or semiconductor die 201. Of course, capacitor 601 may be formed as two separate capacitors in series, where either or both are located in interposer 210 or semiconductor die 201. However, as previously described, forming capacitor 601 in either interposer 210 or semiconductor die 201 involves consuming in additional internal interconnect structure 205 for each external interconnect structure 206. Thus, for purposes of clarity and not limitation, it shall be assumed that capacitor 601 is formed using an air gap 209 as previously described.

Top plate 701 of semiconductor die 201 is positioned for capacitive coupling with bottom plate 702 of interposer 210, as previously described, to provide capacitor 601. Respective ends of inductors 512 and 611 are coupled to one another at an internal interconnect structure or node 205 to provide a series circuit. Such series circuit is coupled in parallel with capacitor 601 to provide a T-coil network 1430. In this exemplary embodiment, another end of inductor 611 of semiconductor die 201 is connected to a resistor 1402 of semiconductor die 201; resistor 1402 may be for a termination resistance for a signaling protocol.

The remainder of differential transceiver 1400 is described as formed in a semiconductor die 201 for this exemplary embodiment. Another end of resistor 1402 may be coupled to a supply voltage bus 1403. Node 205 may be coupled to an ESD circuit formed by diodes 1407. A diode 1407 has its input connected to node 205 and its output connected to a supply voltage bus 1403. Another diode 1407 has its input connected to ground 1408 and its output connect to node 205. Node 205 is further connected to a gate of a driver transistor 1404. In this exemplary embodiment, driver transistor 1404 is illustratively depicted as an NMOS transistor; however, in other embodiments, a PMOS transistor may be used. A source node of driver transistor 1404 is connected to common node 1411. A drain node of driver transistor 1404 is connected to an end of resistor 1405 and to a voltage output port 1406. Another end of resistor 1405 may be coupled to supply voltage bus 1403.

It should be understood that for high-speed signaling, such as high-speed differential serial signaling, return loss and/or frequency response may be problematic. Accordingly, use of T-coil networks 1430 and 1440, as described herein, may be useful in mitigating return loss and/or enhancing frequency response.

Figure 15:
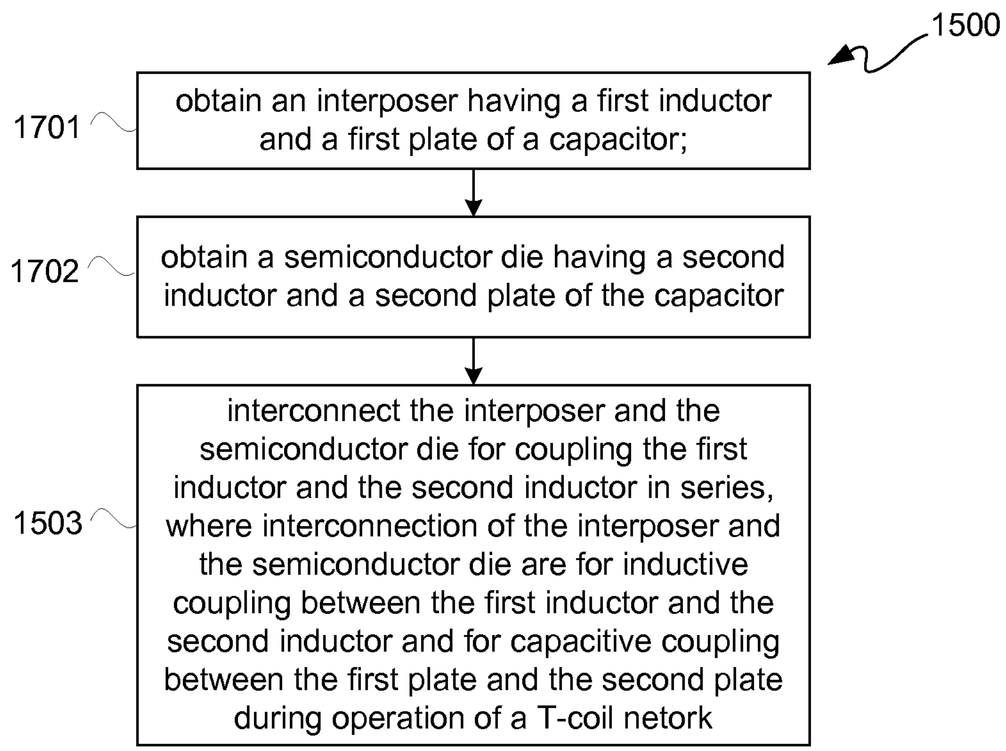
FIG. 15 is a flow diagram depicting an exemplary embodiment of a process flow for forming a T-coil network.

FIG. 15 is a flow diagram depicting an exemplary embodiment of a process flow 1500 for forming a T-coil network, such as previously described for example. At 1501, in interposer is obtained. Such obtained interposer has a first inductor and a first plate of capacitor. At 1502, a semiconductor die is obtained. Such obtained semiconductor die has a second inductor and a second plate of the capacitor. At 1503, the interposer and the die are interconnected to one another for coupling such first and second inductors in series.

Such interconnection may position the first inductor and the second inductor for inductive coupling during operation of such a T-coil network, or more generally during operation of a multichip module 200 for example having such a T-coil network as previously described herein. Furthermore, such interconnection may position the first plate and the second plate for capacitive coupling during such operation. Again, a surface of each of such first plate and said second plate may define an air gap between them. Such air gap may be associated with an offset between such semiconductor die and such interposer. Such semiconductor die may further include an ESD circuit. Such ESD circuit may be coupled to a node located between the first inductor and the second inductor series.

Figure 16:
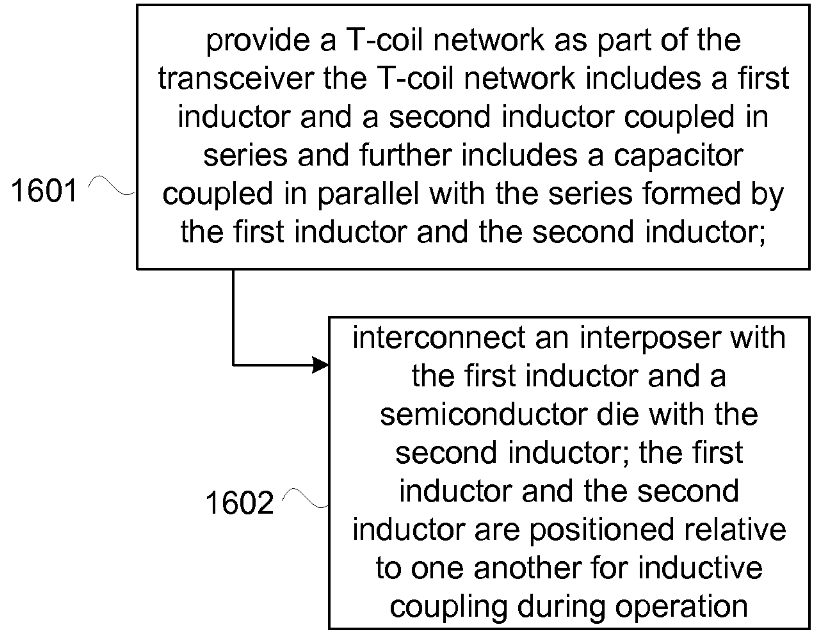
FIG. 16 is a flow diagram depicting an exemplary embodiment of a process flow for improving frequency response of a transceiver.

FIG. 16 is a flow diagram depicting an exemplary embodiment of a process flow 1600 for improving frequency response of a transceiver. At 1601, a T-coil network is provided as part of the transceiver, such as previously described for example with reference to FIG. 14. Such T-coil network may include a first inductor and a second inductor coupled in series. Such T-coil network may further include a capacitor coupled in parallel with the series formed by the first inductor and the second inductor.

The provisioning at 1601 includes interconnecting at 1602 an interposer and a semiconductor die. At 1602, such an interposer, which includes the first inductor, and such a semiconductor die, which includes the second inductor, may be interconnected to position the first and second inductor relative to one another for inductive coupling during operation of such a T-coil network, namely operation of such a transceiver. Furthermore, such an interposer may further include a first plate of such capacitor, and such semiconductor die may include a second plate of such capacitor. The provisioning at 1601 may thus further include positioning the interposer and the semiconductor die such that the first plate and the second plate are separated from one another by an air gap and are capacitively coupled to one another during operation, such as for example operation of a transceiver as previously described herein. Additionally, a node located between the first inductor and the second inductor may be connected to a gate of a driver transistor of such a transceiver.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A multichip module, comprising:

a semiconductor die;

an interposer having conductive layers, dielectric layers, and a substrate;

a plurality of internal interconnect structures that couple the semiconductor die to the interposer;

a plurality of external interconnect structures that are for coupling the interposer to an external device;

a first inductor that comprises at least a portion of one or more of the conductive layers of the interposer;

a first end of the first inductor electrically connected with an internal interconnect structure of the plurality of internal interconnect structures; and a second end of the first inductor electrically connected with an external interconnect structure of the plurality of external interconnect structures.

2. The multichip module according to claim 1, further comprising:

a second inductor coupled in series with the first inductor;

wherein the first inductor and the second inductor are positioned with respect to one another for inductive coupling during operation of the multichip module.

3. The multichip module according to claim 2, wherein the interposer includes both the first inductor and the second inductor.

4. The multichip module according to claim 2, wherein:

the second inductor is coupled to a driver circuit of the semiconductor die; and the driver circuit is selected from a group consisting of an input driver, an output driver, and an input/output driver.

5. The multichip module according to claim 2, wherein:

the first inductor is coupled to a driver circuit of the semiconductor die; and the driver circuit is selected from a group consisting of an input driver, an output driver, and an input/output driver.

6. The multichip module according to claim 1, wherein the second end of the first inductor is electrically wired to the external interconnect structure to electrically connect with the external interconnect structure.

* * * * *